US012652803B2

(12) United States Patent
Lee

(10) Patent No.: US 12,652,803 B2
(45) Date of Patent: Jun. 9, 2026

(54) MEMORY DEVICE AND METHOD OF MANUFACTURING THE SAME

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 304 days.

(21) Appl. No.: 18/518,872

(22) Filed: Nov. 24, 2023

(65) Prior Publication Data

US 2024/0431112 A1 Dec. 26, 2024

(30) Foreign Application Priority Data

Jun. 22, 2023 (KR) ........................ 10-2023-0080364

(51) Int. Cl.
| | |
|---|---|
| *H10B 43/40* | (2023.01) |
| *H10B 41/27* | (2023.01) |
| *H10B 41/41* | (2023.01) |
| *H10B 43/27* | (2023.01) |

(52) U.S. Cl.
CPC ............. *H10B 43/40* (2023.02); *H10B 41/27* (2023.02); *H10B 41/41* (2023.02); *H10B 43/27* (2023.02)

(58) Field of Classification Search
CPC ................................ H10B 43/40; H10B 41/40
See application file for complete search history.

(56) References Cited

U.S. PATENT DOCUMENTS

| | | | | |
|---|---|---|---|---|
| 2018/0350832 A1* | 12/2018 | Barbato | ................ | H10B 43/35 |
| 2022/0059480 A1* | 2/2022 | Park | ........................ | H01L 25/18 |
| 2023/0165006 A1* | 5/2023 | Sung | ...................... | H10B 43/40 |
| | | | | 257/314 |

FOREIGN PATENT DOCUMENTS

| | | |
|---|---|---|
| KR | 1020200140139 A | 12/2020 |
| KR | 1020220060382 A | 5/2022 |

* cited by examiner

*Primary Examiner* — Christopher A Johnson
(74) *Attorney, Agent, or Firm* — WILLIAM PARK AND ASSOCIATES LTD.

(57) ABSTRACT

A memory device, and a method of manufacturing the memory device, includes first and second vertical structures spaced apart from each other and a connection structure contacting bottoms of the first and second vertical structures. The memory device also includes a first gate layer disposed between the first and second vertical structures and a second gate layer enclosing the first and second vertical structures and the connection structure. The memory device further includes a global line disposed on the first vertical structure and a local line disposed on the second vertical structure.

12 Claims, 12 Drawing Sheets

FIG. 4A

MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2023-0080364 filed on Jun. 22, 2023, in the Korean Intellectual Property Office, the entire disclosure of which is incorporated by reference herein.

BACKGROUND

1. Technical Field

Various embodiments of the present disclosure relate to a memory device and a method of manufacturing the memory device, and more particularly, to a memory device including a memory block having a three-dimensional (3D) structure and a method of manufacturing the memory device.

2. Related Art

Memory devices may include nonvolatile memory devices in which stored data is retained even when power supply is interrupted. The nonvolatile memory devices may be classified into a two-dimensional (2D) structure and a three-dimensional (3D) structure according to the structure in which memory cells are arranged. The memory cells of a nonvolatile memory device having a 2D structure may be arranged in a single layer on a substrate, and the memory cells of a nonvolatile memory device having a 3D structure may be vertically stacked on the substrate. Because the degree of integration of the nonvolatile memory device having a 3D structure is higher than that of the nonvolatile memory device having a 2D structure, the number of electronic devices using the nonvolatile memory device having a 3D structure has recently increased.

SUMMARY

An embodiment of the present disclosure is directed to a memory device. The memory device may include: first and second vertical structures spaced apart from each other, a connection structure contacting bottoms of the first and second vertical structures, a first gate layer disposed between the first and second vertical structures, a second gate layer enclosing the first and second vertical structures and the connection structure, a global line disposed on the first vertical structure, and a local line disposed on the second vertical structure.

An embodiment of the present disclosure is directed to a method of manufacturing a memory device. The method may include: forming a first material layer on a substrate, forming a trench in the first material layer, forming a sacrificial layer in the trench, forming a second material layer on the first material layer and the sacrificial layer, forming holes that pass through the second material layer to expose a portion of the sacrificial layer, removing the sacrificial layer exposed through the holes, and forming a channel layer along inner walls of the trench and the holes.

BRIEF DESCRIPTION OF THE DRAWINGS

FIGS. 4A to 4D are views illustrating the structure of a row decoder according to an embodiment of the present disclosure.

DETAILED DESCRIPTION

Specific structural or functional descriptions in the embodiments according to the concept of the present disclosure introduced in this specification or application are only for description of the embodiments according to the concept of the present disclosure. The embodiments according to the concept of the present disclosure may be practiced in various forms, and should not be construed as being limited to the embodiments described in the specification or application.

Hereinafter, various embodiments of the present disclosure will be described in detail with reference to the accompanying drawings in which embodiments of the present disclosure are shown so that those skilled in the art to which the present disclosure pertains can practice the technical spirit of the present disclosure.

Some embodiments of the present disclosure are directed to a memory device in which the area of a peripheral circuit is reduced, and a method of manufacturing the memory device.

Figure 1:
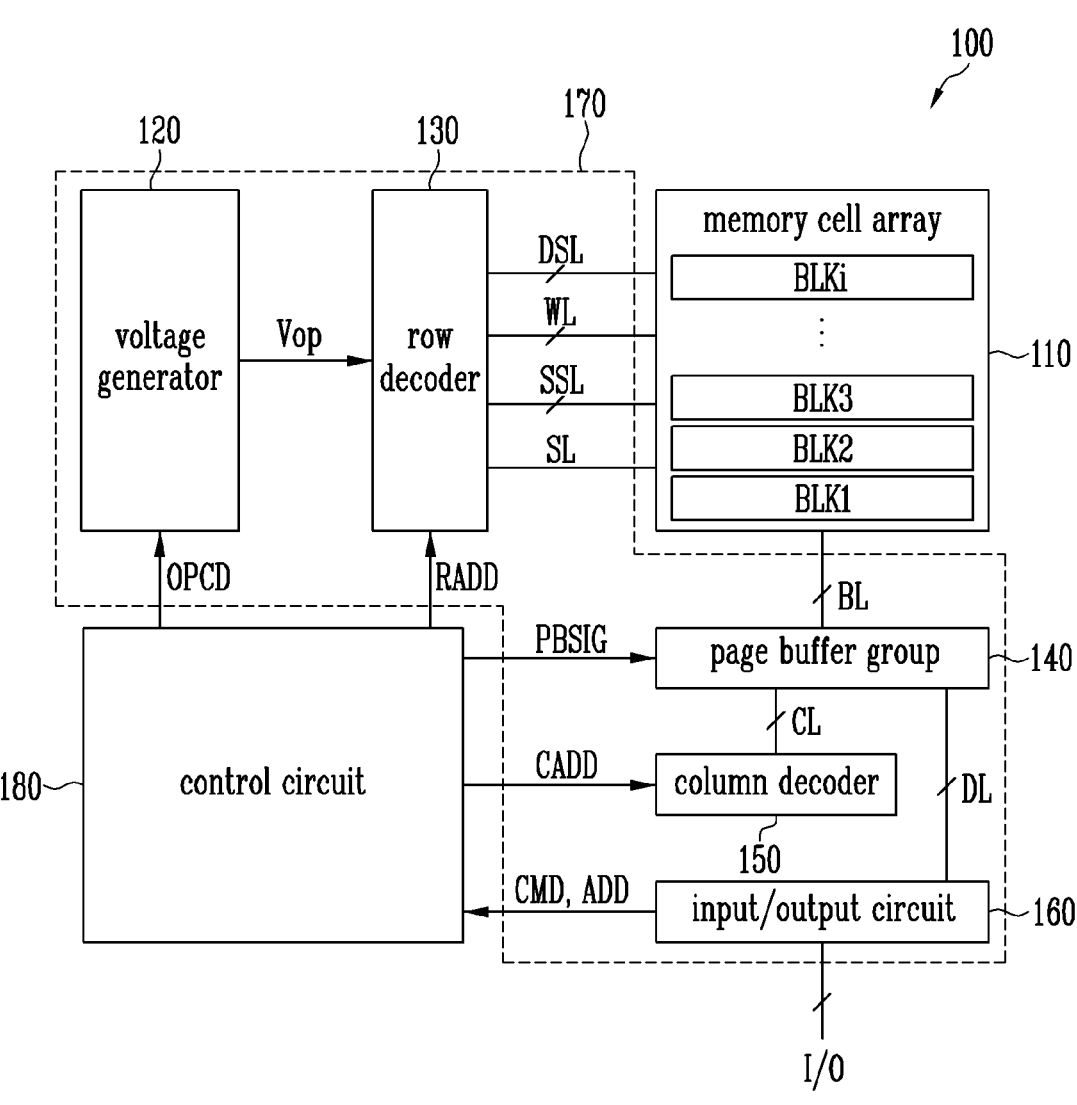
FIG. 1 is a diagram illustrating a memory device according to an embodiment of the present disclosure.

FIG. 1 is a diagram illustrating a memory device according to an embodiment of the present disclosure.

Referring to FIG. 1, a memory device 100 may include a memory cell array 110, a peripheral circuit 170, and a control circuit 180.

The memory cell array 110 may include first to i-th memory blocks BLK1 to BLKi. Each of the first to i-th memory blocks BLK1 to BLKi may include a plurality of memory cells that are capable of storing data. Drain select lines DSL, word lines WL, source select lines SSL, and a source line SL may be coupled to each of the first to i-th memory blocks BLK1 to BLKi, and bit lines BL may be coupled in common to the first to i-th memory blocks BLK1 to BLKi.

Each of the first to i-th memory blocks BLK1 to BLKi may be formed to have a three-dimensional (3D) structure. Each memory block having a 3D structure may include memory cells stacked on a substrate in a vertical direction.

According to a program scheme, each memory cell may store 1 bit of data or 2 or more bits of data. For example, a scheme for storing 1 bit of data in one memory cell is referred to as a single-level cell (SLC) scheme, and a scheme for storing 2 bits of data in one memory cell is referred to as a multi-level cell (MLC) scheme. A scheme for storing 3 bits of data in one memory cell is referred to as a triple-level cell (TLC) scheme, and a scheme for storing 4 bits of data in one memory cell is referred to as a quad-level cell (QLC) scheme. In addition, 5 or more bits of data may be stored in one memory cell.

The peripheral circuit 170 may perform a program operation of storing data in the memory cell array 110, a read operation of outputting data stored in the memory cell array 110, and an erase operation of erasing data stored in the memory cell array 110. For example, the peripheral circuit 170 may include a voltage generator 120, a row decoder 130, a page buffer group 140, a column decoder 150, and an input/output circuit 160.

The voltage generator 120 may generate various operating voltages Vop that are used for a program operation, a read operation, or an erase operation in response to an operation code OPCD. For example, the voltage generator 120 may generate program voltages, turn-on voltages, turn-off voltages, negative voltages, precharge voltages, verify voltages, read voltages, pass voltages, or erase voltages in response to the operation code OPCD. The operating voltages Vop generated by the voltage generator 120 may be applied to the drain select lines DSL, the word lines WL, the source select lines SSL, and the source line SL of a memory block selected through the row decoder 130.

The program voltages may be voltages that are applied to a selected word line among the word lines WL during a program operation, and may be used to increase the threshold voltages of memory cells coupled to the selected word line. The turn-on voltages may be applied to the drain select lines DSL or the source select lines SSL, and may be used to turn on drain select transistors or source select transistors. The turn-off voltages may be applied to the drain select lines DSL or the source select lines SSL, and may be used to turn off the drain select transistors or source select transistors. For example, the turn-off voltage may be set to 0 V. The precharge voltages may be voltages higher than 0 V, and may be applied to the bit lines during a read operation. The verify voltages may be used for a verify operation of determining whether the threshold voltages of selected memory cells have increased to a target level. The verify voltages may be set to various levels according to the target level, and may be applied to a selected word line.

The read voltages may be applied to the selected word line during a read operation performed on the selected memory cells. For example, the read voltages may be set to various levels according to the program scheme for the selected memory cells. The pass voltages may be voltages that are applied to unselected word lines among the word lines WL during a program or read operation, and may be used to turn on memory cells coupled to the unselected word lines. The erase voltages may be used during an erase operation of erasing the memory cells included in the selected memory block, and may be applied to the source line SL.

The row decoder 130 may transfer the operating voltages Vop to the drain select lines DSL, the word lines WL, the source select lines SSL, and the source line SL, which are coupled to a memory block selected according to the row address RADD. For example, the row decoder 130 may be coupled to the voltage generator 120 through global lines, and may be coupled to the first to i-th memory blocks BLK1 to BLKi through local lines (e.g., the drain select lines DSL, the word lines WL, the source select lines SSL, and the source line SL). The global lines and the local lines will be described in detail later with reference to FIG. 2.

The page buffer group 140 may include page buffers (not illustrated) coupled to the first to i-th memory blocks BLK1 to BLKi, respectively. The page buffers (not illustrated) may be coupled to the first to i-th memory blocks BLK1 to BLKi through the bit lines BL. During a read operation the page buffers (not illustrated) may sense the currents or voltages of bit lines varying with the threshold voltages of the selected memory cells in response to page buffer control signals PBSIG, and may temporarily store the sensed data.

The column decoder 150 may be configured such that data is transferred between the page buffer group 140 and the input/output circuit 160 in response to a column address CADD. For example, the column decoder 150 may be coupled to the page buffer group 140 through column lines CL, and may transmit enable signals through the column lines CL. The page buffers (not illustrated) included in the page buffer group 140 may receive or output data through data lines DL in response to the enable signals.

The input/output circuit 160 may receive or output a command CMD, an address ADD, or data through input/output lines I/O. For example, the input/output circuit 160 may transmit the command CMD and the address ADD, received from an external controller through the input/output lines I/O, to the control circuit 180, and may transmit the data, received from the external controller through the input/output lines I/O, to the page buffer group 140. Alternatively, the input/output circuit 160 may output data, received from the page buffer group 140, to the external controller through the input/output lines I/O.

The control circuit 180 may output at least one of the operation code OPCD, the row address RADD, the page buffer control signals PBSIG, or the column address CADD in response to the command CMD and the address ADD. For example, when the command CMD input to the control circuit 180 is a command corresponding to a program operation, the control circuit 180 may control the peripheral circuit 170 so that a program operation is performed on a memory block selected by the address ADD. When the command CMD input to the control circuit 180 is a command corresponding to a read operation, the control circuit 180 may control the peripheral circuit 170 so that a read operation is performed on a memory block selected by the address and read data is output. When the command CMD input to the control circuit 180 is a command corresponding to an erase operation, the control circuit 180 may control the peripheral circuit 170 so that an erase operation is performed on a selected memory block.

Figure 2:
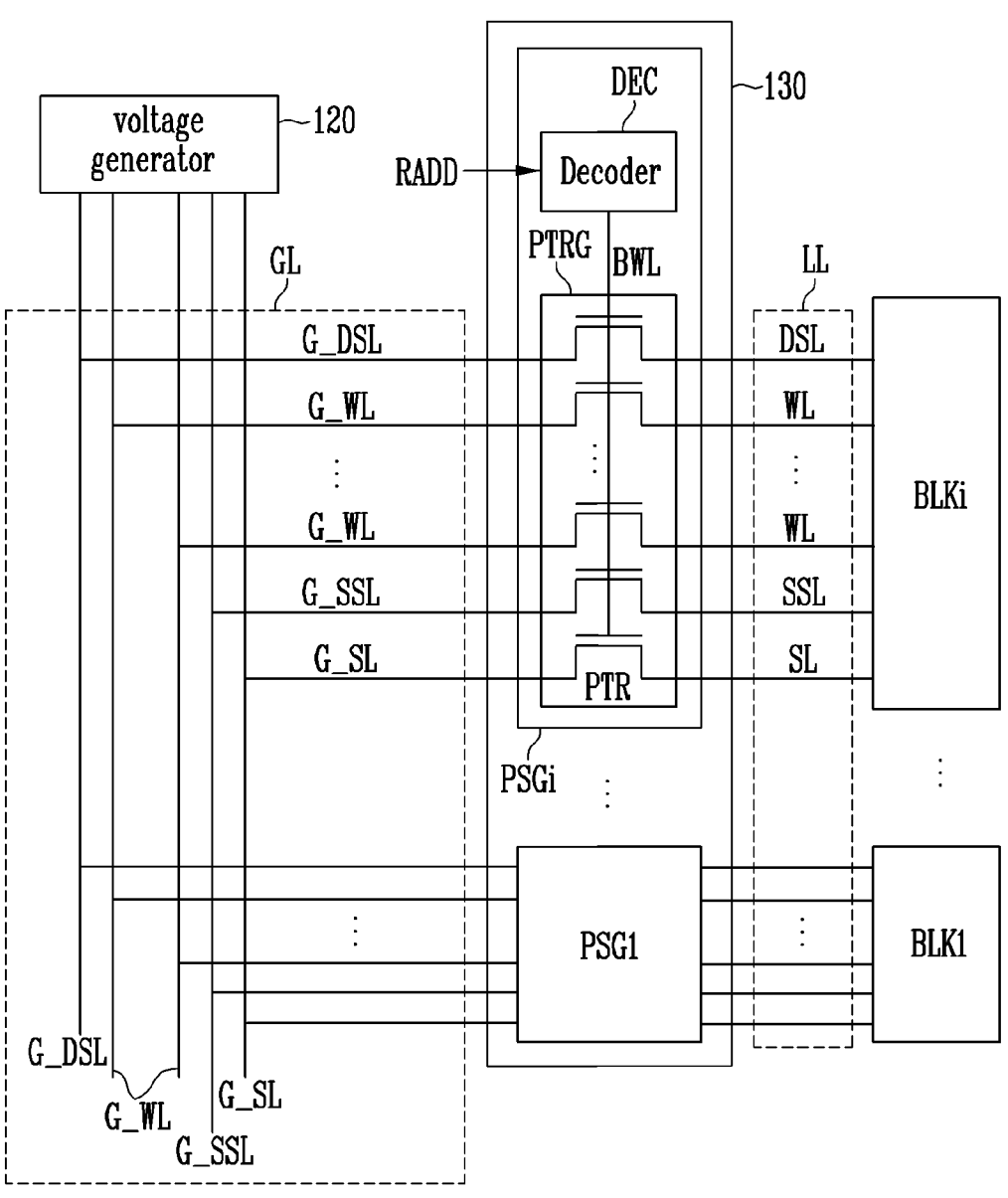
FIG. 2 is a diagram illustrating in detail global lines and local lines according to an embodiment of the present disclosure.

FIG. 2 is a diagram illustrating in detail global lines and local lines according to an embodiment of the present disclosure.

Referring to FIG. 2, the row decoder 130 may include first to i-th pass switching groups PSG1 to PSGi respectively corresponding to first to i-th memory blocks BLK1 to BLKi. Although description will be made based on the configuration of the i-th pass switching group PSGi in FIG. 2 for convenience of description, the description of the i-th pass switching group PSGi may also be applied to the remaining pass switching groups.

The i-th pass switching group PSGi may include a decoder DEC, a block word line BWL, and a pass transistor group PTRG. The pass transistor group PTRG may include a plurality of pass transistors PTR.

The plurality of pass transistors PTR included in the pass transistor group PTRG may be coupled to the voltage generator 120 through global lines GL, and may be coupled to the i-th memory block BLKi through local lines LL. The local lines LL may include a drain select line DSL, word lines WL, a source select line SSL, and a source line SL. The global lines GL may include a global drain select line G_DSL, global word lines G_WL, a global source select line G_SSL, and a global source line G_SL.

The row decoder 130 may couple the global lines GL to local lines LL coupled to a memory block, selected according to a row address RADD among the first to i-th memory blocks BLK1 to BLKi. Also, the row decoder 130 might not couple the global lines GL to local lines LL coupled to a memory block which is not selected according to the row address RADD among the first to i-th memory blocks BLK1 to BLKi.

The decoder DEC may turn on or off the pass transistors PTR by applying a block control signal to a block word line BWL according to the received row address RADD. In an example, when the decoder DEC receives a row address RADD for activating an i-th pass switching group PSGi, the decoder DEC may turn on the pass transistors PTR included in the i-th pass switching group PSGi by applying the block control signal having a high voltage to the block word line BWL. In an example, when the decoder DEC receives a row address RADD for deactivating the i-th pass switching group PSGi, the decoder DEC may turn off the pass transistors PTR included in the i-th pass switching group PSGi by deactivating the block control signal. For example, the deactivated block control signal may have a turn-off voltage.

When the pass transistors PTR of the i-th pass switching group PSGi are turned on, the global drain select line G_DSL and the drain select line DSL, the global word lines G_WL and the word lines WL, the global source select line G_SSL and the source select line SSL, and the global source line G_SL and the source line SL may be electrically connected to each other through respective pass transistors PTR. When the pass transistors PTR are turned on, operating voltages (e.g., Vop of FIG. 1) generated by the voltage generator 120 may be transmitted to the i-th memory block BLKi through the global lines GL, the pass transistors PTR, and the local lines LL.

When the pass transistors PTR of the i-th pass switching group PSGi are turned off, the global drain select line G_DSL and the drain select line DSL, the global word lines G_WL and the word lines WL, the global source select line G_SSL and the source select line SSL, and the global source line G_SL and the source line SL may be electrically disconnected from each other through respective pass transistors PTR. When the pass transistors PTR are turned off, the operating voltages Vop that are generated by the voltage generator 120 and applied to the global lines GL might not be transmitted to the i-th memory block BLKi.

Figure 3:
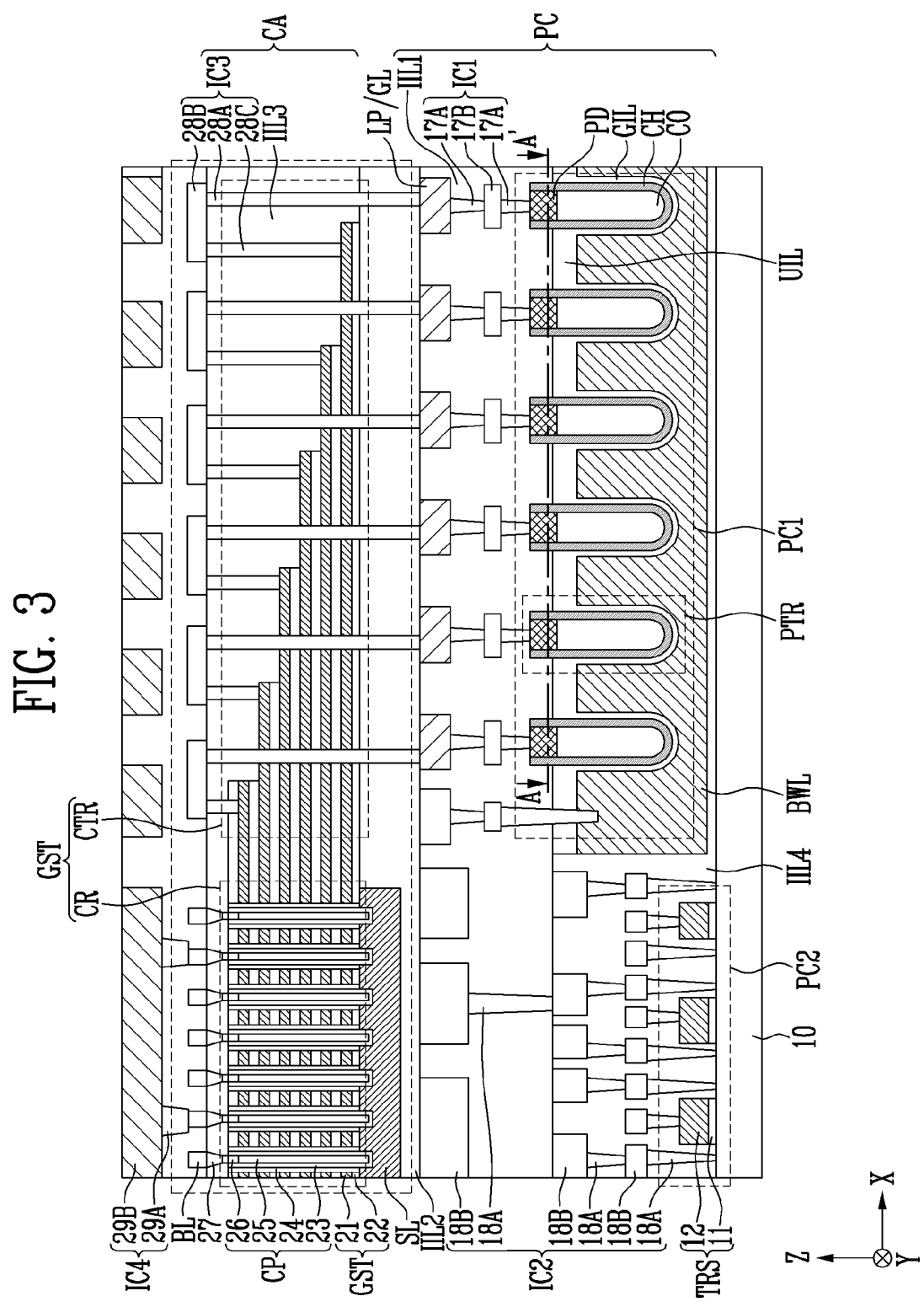
FIG. 3 is a view illustrating the structure of a memory device according to an embodiment of the present disclosure.

FIG. 3 is a view illustrating the structure of a memory device according to an embodiment of the present disclosure.

Referring to FIG. 3, the memory device 100 may include a cell array CA and a peripheral circuit PC. In an embodiment, the cell array CA and the peripheral circuit PC may be included in the same wafer, and the cell array CA may be stacked on the peripheral circuit PC. In an embodiment, the cell array CA and the peripheral circuit PC may be included in different wafers, and the memory device 100 may have a structure in which at least two wafers are bonded to each other.

The memory device 100 may include a block word line BWL, pass transistors PTR, local pads LP, and global lines GL. The memory device 100 may further include at least one of a substrate 10, a gate structure GST, cell plugs CP, a source line SL, bit lines BL, a first interlayer insulating layer IIL1, a second interlayer insulating layer IIL2, a third interlayer insulating layer IIL3, a fourth interlayer insulating layer IIL4, a first interconnection structure IC1, a second interconnection structure IC2, a third interconnection structure IC3, or a fourth interconnection structure IC4.

The cell array CA may include at least one of the source line SL, the cell plugs CP, the gate structure GST, vias 27, or the bit lines BL. The gate structure GST may be disposed between the source line SL and the bit lines BL.

The gate structure GST may include a cell region CR and a contact region CTR. The gate structure GST may include stacked gate lines 21. For example, the gate structure GST may include gate lines 21 and insulating layers 22 that are alternately stacked. Among the gate lines 21 included in the gate structure GST, the uppermost gate line may be a drain select line DSL, the lowermost gate line may be a source select line SSL, and the remaining gate lines may be word lines WL.

In the contact region CTR of the gate structure GST, the gate lines 21 may be individually exposed. In an example, the contact region CTR of the gate structure GST may have a step shape. The third interconnection structure IC3 may be formed in the contact region CTR of the gate structure GST. The third interconnection structure IC3 may transfer a bias to the gate lines 21. The third interconnection structure IC3 may include one or more contact plugs 28A and 28C and one or more lines 28B.

The local line LL, described above with reference to FIG. 2, may include at least one of the local pads LP, the third interconnection structure IC3, or the gate lines 21, which are illustrated in FIG. 3. In FIG. 3 and subsequent drawings, the local line LL may indicate each of the local pads LP, the third interconnection structure IC3, or the gate lines 21, or a combination of two or more thereof.

The cell plugs CP may be located in the cell region CR of the gate structure GST. The cell plugs CP may penetrate the gate lines 21. In regions in which the cell plugs CP and the gate lines 21 intersect each other, memory cells or select transistors may be formed. The cell plugs CP may be disposed between the source line SL and the bit lines BL. The cell plugs CP and the bit lines BL may be coupled to each other through the vias 27. The fourth interconnection structure IC4 may be coupled to the bit lines BL. The fourth interconnection structure IC4 may include at least some of one or more contact plugs 29A or one or more lines 29B.

Each of the cell plugs CP may include a channel layer 23, a memory layer 24, an insulating column 25, and a capping layer 26. The memory layer 24 may enclose the sidewall of the channel layer 23. The memory layer 24 may include at least one of a tunneling layer, a data storage layer, or a blocking layer. The insulating column 25 may be formed in a cylindrical shape in a region enclosed by the channel layer 23. The insulating column 25 may be formed of oxide, nitride, or air gap. The capping layer 26 may be disposed on the insulating column 25, and may be directly coupled to the channel layer 23. The capping layer 26 may include a junction doped with impurities.

The peripheral circuit PC may include a first peripheral circuit PC1 and a second peripheral circuit PC2. The first peripheral circuit PC1 may be disposed below the contact region CTR. The first peripheral circuit PC1 may include a row decoder 130. The first peripheral circuit PC1 may include the block word line BWL and the pass transistors PTR. The pass transistors PTR may be coupled to the global lines GL and the local pads.

The block word line BWL may be formed by depositing a conductive layer on the substrate 10. In an example, the block word line BWL may be formed by depositing polysilicon on the substrate 10. In an example, the block word line BWL may be formed by doping the substrate 10 with impurities. The impurities may include arsenic (As) or phosphorus (P).

The pass transistors PTR may connect the global lines GL and the local lines (e.g., local pads LP) to each other. The pass transistors PTR may be switches for controlling connections between the global lines GL and the local lines LL.

Each pass transistor PTR may include a channel layer CH disposed in the block word line BWL. The pass transistors PTR may be formed in portions in which the block word line BWL and channel layers CH intersect. The block word line BWL enclosing the channel layers CH may be the gate electrodes of the pass transistors PTR. For example, the pass transistors PTR may be high-voltage NMOS transistors. The channel layer CH of each pass transistor PTR may include a pipe structure. The detailed shape of the pass transistors PTR will be described in detail later with reference to FIG. 4B.

The corresponding pass transistor PTR may be turned on or off in response to the block control signal applied to the block word line BWL. When the pass transistor PTR is turned on, the global lines GL may be connected to the local lines LL, and operating voltages Vop may be transferred from the global lines GL to the local lines LL. When the pass transistor PTR is turned off, the global lines GL and the local lines LL may be disconnected from each other.

Each pass transistor PTR may further include a gate insulating layer GIL, an insulating column CO, and a pad PD. The gate insulating layer GIL may be disposed between the channel layer CH and the block word line BWL. The gate insulating layer GIL may be formed to enclose the sidewall of the channel layer CH. The gate insulating layer GIL may extend to an upper insulating layer UIL formed along the upper surface of the block word line BWL. Each of the gate insulating layer GIL and the upper insulating layer UIL may include an oxide layer, which may be formed using a deposition method or an oxidization method. The insulating column CO may be disposed in a space enclosed by the channel layer CH. The insulating column CO may be formed of oxide, nitride, or air gap.

The pad PD may be disposed on the insulating column CO, or may be coupled to the channel layer CH. For example, the pad PD may be formed to be enclosed by the channel layer CH. The pad PD may be disposed over the block word line BWL. For example, the pad PD may be formed to protrude from the upper surface of the block word line BWL. The pad PD and the block word line BWL may be insulated from each other by the upper insulating layer UIL and the gate insulating layer GIL. The pad PD may be either a source pad including a source region or a drain pad including a drain region. The source pad and the drain pad will be described in detail later with reference to FIGS. 4A and 4B.

The first interconnection structure IC1 may be coupled to the first peripheral circuit PC1. For example, the first interconnection structure IC1 may be coupled to the pad PD of each pass transistor PTR. The first interconnection structure IC1 may be disposed in the first interlayer insulating layer IIL1. The first interconnection structure IC1 may include one or more contact plugs 17A and one or more lines 17B. The pass transistor PTR may be coupled to the local lines LL and the global lines GL through the first interconnection structure IC1. For example, among the contact plugs 17A, the contact plug 17A disposed under the line 17B may be coupled to the pad PD, and the contact plug 17A disposed on the line 17B may be coupled to the corresponding local pad LP or global line GL.

The gate lines 21 may be coupled to the local pad LP through the third interconnection structure IC3. Contact plugs 28A may extend in a direction that penetrates the gate lines 21 to electrically connect the local pads LP to lines 28B, respectively. Also, contact plugs 28C may extend in a direction that penetrates the gate lines 21 to electrically connect the lines 28B to the gate lines 21, respectively. For example, the contact plugs 28A may penetrate the third interlayer insulating layer IIL3, the gate structure GST, and the second interlayer insulating layer IIL2, or may penetrate the third interlayer insulating layer IIL3 and the second interlayer insulating layer IIL2. Further, the contact plugs 28C may penetrate the third interlayer insulating layer IIL3. Therefore, the local pads LP may be coupled to the gate lines 21, respectively, through the contact plugs 28A and 28C and the lines 28B. Furthermore, it may be understood that the local pads LP, the third interconnection structure IC3, and the gate lines 21, which are connected to each other, are components included in the local lines LL.

The second peripheral circuit PC2 may be disposed below the cell region CR. The second peripheral circuit PC2 may include transistors TRS disposed on the substrate 10. Each of the transistors TRS may include a gate insulating layer 11 and a gate electrode 12 disposed on the substrate 10. The transistors TRS may be planar transistors. The second peripheral circuit PC2 may include page buffers included in the page buffer group 140.

The second interconnection structure IC2 may be coupled to the second peripheral circuit PC2. The second interconnection structure IC2 may include one or more contact plugs 18A and one or more lines 18B. A portion of the second interconnection structure IC2 may be arranged in the first interlayer insulating layer IIL1, and the remaining portion thereof may be arranged in the fourth interlayer insulating layer IIL4. The fourth interlayer insulating layer IIL4 may extend to a portion under the block word line BWL.

According to the structure illustrated in FIG. 3, the pass transistors PTR may be disposed in the block word line BWL. Because the channel layer CH of each pass transistor PTR includes a pipe structure, the area in which the channel layer CH meets the block word line BWL may increase while a volume occupied by the pass transistor PTR is reduced. Furthermore, according to the present disclosure, the size of the pass transistor PTR may be reduced compared to a conventional scheme, with the result that the area of the contact region CTR of the gate structure GST may decrease. As the area of the contact region CTR decreases, the volume of the third interlayer insulating layer IIL3 may also decrease, and thus wafer warpage may be prevented or minimized.

FIGS. 4A to 4D are views illustrating the structure of a row decoder according to an embodiment of the present disclosure.

Figure 4A:
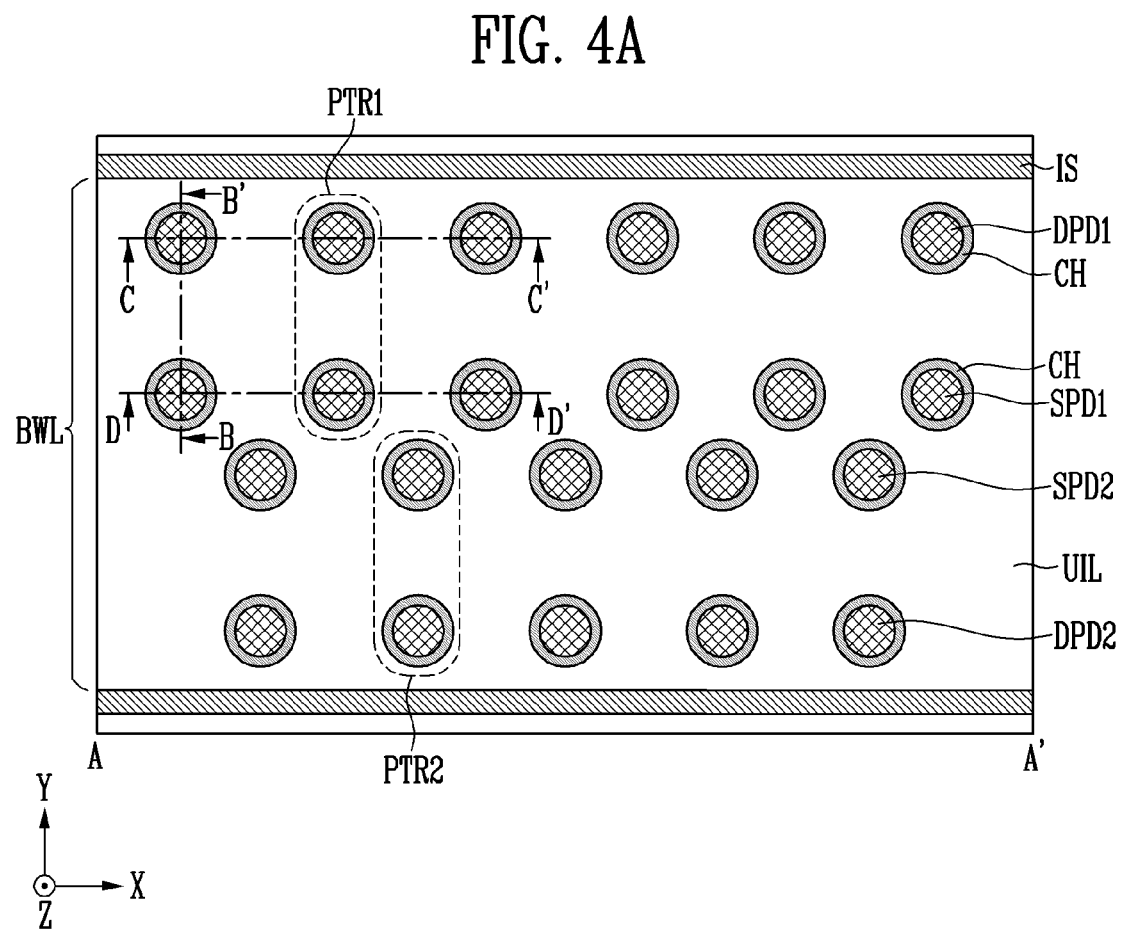
Figure 4B:
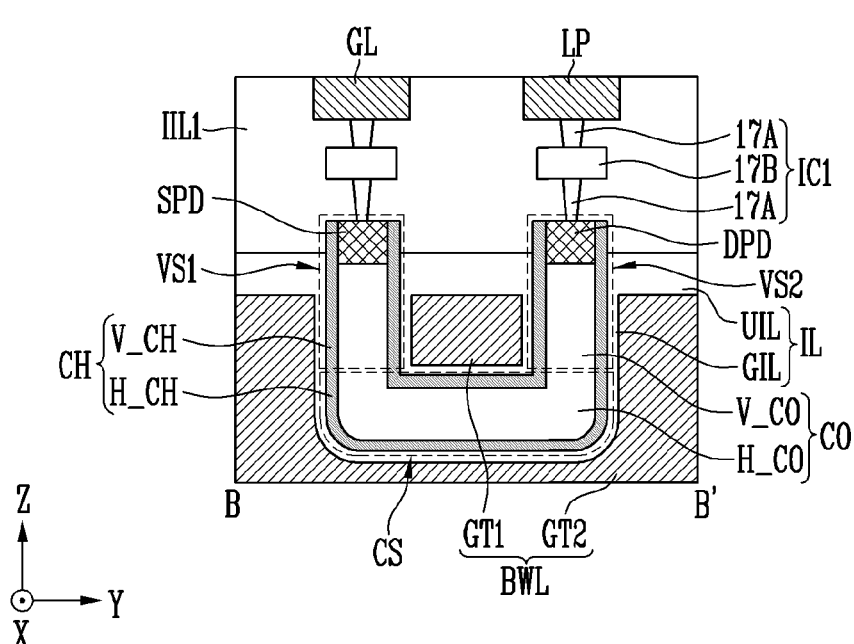
Figure 4C:
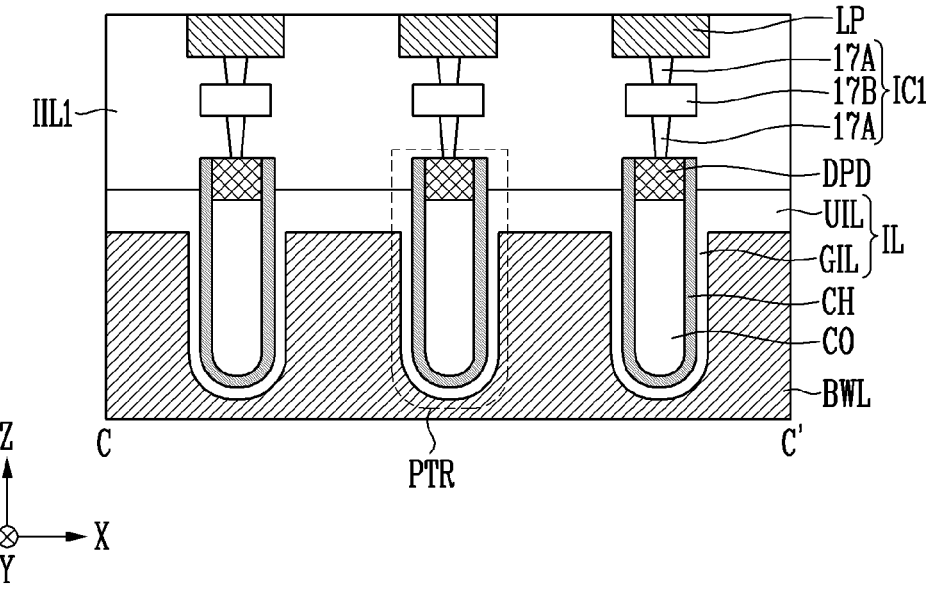
Figure 4D:
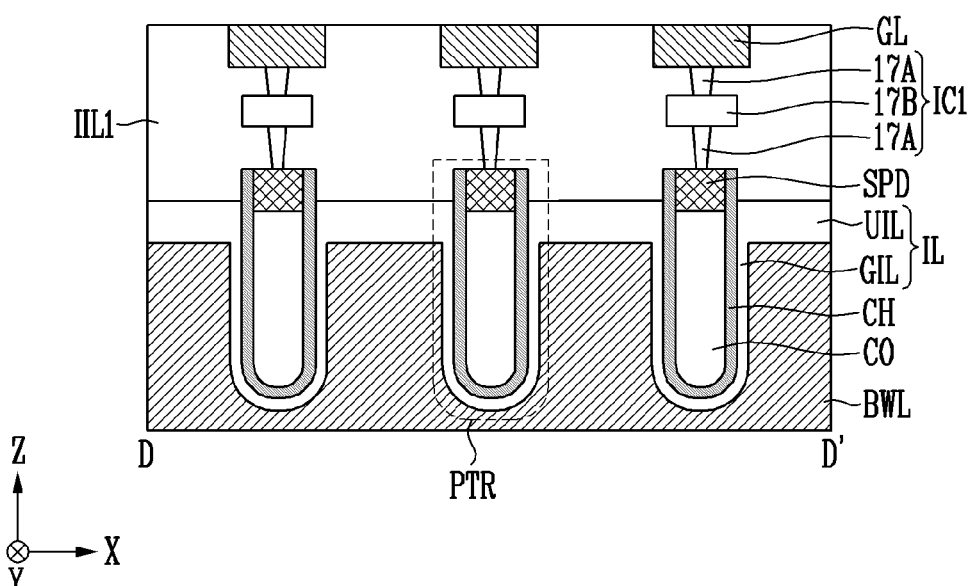

FIG. 4A may illustrate the layout of a cross-section taken along line A-A' of FIG. 3. FIG. 4B is a sectional view taken along line B-B' of FIG. 4A. FIG. 4C is a sectional view taken along line C-C' of FIG. 4A. FIG. 4D is a sectional view taken along line D-D' of FIG. 4A. Hereinafter, description of configuration identical to that described above will be omitted or will be made in brief.

Referring to FIG. 4A, the memory device 100 may include a block word line BWL, first pass transistors PTR1, and second pass transistors PTR2. Referring to FIG. 4A, the memory device 100 may further include isolation structures IS for separating the block word line BWL.

The block word line BWL may extend in an X direction. An additional block word line may be disposed in a Y direction of the block word line BWL. The block word line BWL and the additional block word line may be insulated from each other by the isolation structure IS. Each isolation structure IS may extend in the X direction.

In the block word line BWL, the first pass transistors PTR1 and the second pass transistors PTR2 may be formed. The first pass transistors PTR1 may be arranged adjacent to each other in the X direction, and the second pass transistors PTR2 may also be arranged adjacent to each other in the X direction. The first pass transistors PTR1 and the second pass transistor PTR2 may be arranged such that central axes thereof (e.g., axes parallel to the Y direction) are offset from each other. Unlike the structure illustrated in FIG. 4A, the first pass transistors PTR1 and the second pass transistors PTR2 may be arranged such that the central axes thereof overlap each other.

Each of the first pass transistors PTR1 may include a first source pad SPD1, a first drain pad DPD1, and a channel layer CH. Each of the second pass transistors PTR2 may include a second source pad SPD2, a second drain pad DPD2, and a channel layer CH. FIG. 4A shows an embodiment in which, among the pads PD included in the first pass transistor PTR1 and the second pass transistor PTR2, pads closer to the isolation structures IS are drain pads (e.g., the first drain pad DPD1 and the second drain pad DPD2), and respective source pads (e.g., the first source pad SPD1 and the second source pad SPD2) of the pass transistors PTR1 and PTR2 are adjacent to each other. However, this is only an embodiment, and various embodiments may be implemented in addition to the above embodiment. For example, the first source pad SPD1 of the first pass transistor PTR1 and the second drain pad DPD2 of the second pass transistor PTR2 may be formed adjacent to each other. Alternatively, the first drain pad DPD1 of the first pass transistor PTR1 and the second source pad SPD2 of the second pass transistor PTR2 may be formed adjacent to each other. Alternatively, the first drain pad DPD1 of the first pass transistor PTR1 and the second drain pad DPD2 of the second pass transistor PTR2 may be formed adjacent to each other.

The first drain pad DPD1, the first source pad SPD1, the second source pad SPD2, and the second drain pad DPD2 may be enclosed by respective channel layers CH. Also, the first drain pad DPD1, the first source pad SPD1, the second source pad SPD2, and the second drain pad DPD2 may protrude from an upper insulating layer UIL formed on the upper surface of the block word line BWL in a Z direction.

In FIG. 4A, the pass transistors PTR are separated into the first pass transistors PTR1 and the second pass transistors PTR2 to describe the cross-section of line A-A' of FIG. 3, but the first pass transistors PTR1 and the second pass transistors PTR2 may have no differences between actual configurations thereof. Therefore, hereinafter, description will be made based only on the pass transistor PTR without distinguishing the first pass transistors PTR1 from the second pass transistors PTR2.

FIG. 4B illustrates a cross-section taken along line B-B' of FIG. 4A. Referring to FIGS. 4A and 4B, the pass transistor PTR may include a first vertical structure VS1, a second vertical structure VS2, and a connection structure CS. The first vertical structure VS1 and the second vertical structure VS2 may be spaced apart from each other in the Y direction. The connection structure CS may contact the bottoms of the first vertical structure VS1 and the second vertical structure VS2. The connection structure CS may have a pipe structure extending in the Y direction. In the present disclosure, the pipe structure may refer to a structure in which both ends of the connection structure CS contact the bottom of the first vertical structure VS1 and the bottom of the second vertical structure VS2. For example, the first and second vertical structures VS1 and VS2 may be coupled to each other through the connection structure CS.

Each of the first vertical structure VS1 and the second vertical structure VS2 may include vertical channel layers V_CH, vertical insulating columns V_CO enclosed by the vertical channel layers V_CH, and pads (e.g., a source pad SPD or a drain pad DPD) on the vertical insulating columns V_CO. The first vertical structure VS1 may include the source pad SPD, and the second vertical structure VS2 may include the drain pad DPD. The vertical channel layers V_CH may enclose the source pad SPD and the drain pad DPD, respectively.

The connection structure CS may include a horizontal channel layer H_CH and a horizontal insulating column H_CO enclosed by the horizontal channel layer H_CH. The horizontal channel layer H_CH may extend to the vertical channel layers V_CH. Further, the horizontal insulating column H_CO may extend to the vertical insulating columns V_CO.

In the present disclosure, the channel layer CH may include the horizontal channel layer H_CH and the vertical channel layers V_CH that extend to each other. Therefore, the channel layer CH may be coupled to the source pad SPD and the drain pad DPD. Furthermore, in the present disclosure, the insulating column CO may include the horizontal insulating column H_CO and the vertical insulating columns V_CO that extend to each other.

Referring to FIG. 4B, the block word line BWL may include a first gate layer GT1 and a second gate layer GT2. The first gate layer GT1 may be disposed between the first vertical structure VS1 and the second vertical structure VS2. The first gate layer GT1 may be disposed on the connection structure CS. The second gate layer GT2 may enclose the first vertical structure VS1, the second vertical structure VS2, and the connection structure CS. Referring to FIGS. 4A and 4B together, the first gate layer GT1 and the second gate layer GT2 may extend to each other to enclose the first vertical structure VS1, the second vertical structure VS2, and the connection structure CS. That is, illustration in which the first gate layer GT1 and the second gate layer GT2 are separated from each other in FIG. 4B is made only for convenience of description. For an embodiment, the gate layers GT1 and GT2 may be components that are not physically separated from each other.

The block word line BWL enclosing the channel layer CH may be used as the gate electrode of the pass transistor PTR. Because the pass transistor PTR according to the present disclosure includes the first and second vertical structures VS1 and VS2 spaced apart from each other and the connection structure CS, the area of the gate electrode adjacent to the channel layer CH may increase compared to existing structures. Therefore, the area of the block word line BWL contacting the channel layer CH may increase compared to the volume occupied by the pass transistor PTR within the block word line BWL. Accordingly, in accordance with the present disclosure, the volume occupied by the pass transistors PTR in the memory device 100 may be reduced.

Referring to FIG. 4B, the memory device 100 may further include a gate insulating layer GIL disposed between the first and second vertical structures VS1 and VS2 and the first and second gate layers GT1 and GT2 and between the connection structure CS and the first and second gate layers GT1 and GT2. The gate insulating layer GIL may be formed to enclose the sidewall of the channel layer CH. The gate insulating layer GIL may be disposed between the vertical channel layers V_CH and the block word line BWL and between the horizontal channel layer H_CH and the block word line BWL.

The gate insulating layer GIL may extend to an upper insulating layer UIL formed along the upper surface of the block word line BWL. An insulating layer IL may include the gate insulating layer GIL and the upper insulating layer UIL. The source pad SPD and the drain pad DPD may protrude higher than the upper insulating layer UIL in the Z direction. The channel layer CH (e.g., vertical channel layers V_CH) enclosing the source pad SPD and the drain pad DPD may protrude higher than the upper insulating layer UIL in the Z direction. Because the source pad SPD and the drain pad DPD are individually enclosed by the channel layer CH, they might not directly contact the upper insulating layer UIL.

The memory device 100 may include a global line GL on the first vertical structure VS1 and a local pad LP on the second vertical structure VS2. The local pad LP may be understood to be a component included in the local line LL. The pass transistor PTR may be coupled to the local pad LP through the drain pad DPD and may be coupled to the global line GL through the source pad SPD.

The memory device 100 may further include a first interconnection structure IC1 which connects the source pad SPD to the global line GL and connects the drain pad DPD to the local pad LP. The first interconnection structure IC1 may include one or more contact plugs 17A and one or more lines 17B. The first interconnection structure IC1 may be disposed in the first interlayer insulating layer IIL1.

FIG. 4C illustrates a cross-section taken along line C-C' of FIG. 4A, and FIG. 4D illustrates a cross-section taken along line D-D' of FIG. 4A. In relation to FIGS. 4C and 4D, description of configurations identical to those described in FIGS. 3, 4A, and 4B will be omitted or made in brief.

Referring to FIG. 4C, local pads LP may be disposed over the block word line BWL. The local pads LP may be arranged along an X direction. The local pads LP may be coupled to drain pads DPD of the pass transistors PTR, respectively. The first interconnection structure IC1 may connect the drain pads DPD to the local pads LP, respectively.

Referring to FIG. 4D, global lines GL may be disposed over the block word line BWL. The global lines GL may be arranged along an X direction. The global lines GL may be coupled to source pads SPD of the pass transistors PTR, respectively. The first interconnection structure IC1 may connect the source pads SPD to the global lines GL, respectively.

The pass transistors PTR may be turned on or off depending on the voltage applied to the block word line BWL. For example, when the pass transistors PTR are turned on, the global lines GL of FIG. 4D may be electrically connected to the local pads LP of FIG. 4C through the pass transistors PTR, respectively. Also, when the pass transistors PTR are turned off, the global lines GL of FIG. 4D may be electrically disconnected from the local pads LP of FIG. 4C by the pass transistors PTR, respectively.

FIGS. 5A to 9A and FIGS. 5B to 9B are views illustrating a method of manufacturing a row decoder according to an embodiment of the present disclosure. Drawings corresponding to 'A' in respective figures may illustrate the layout of a cross-section taken along line A-A' of FIG. 3, and drawings corresponding to 'B' may be sectional views taken along line B-B' of respective drawings 'A'.

Figure 5A:
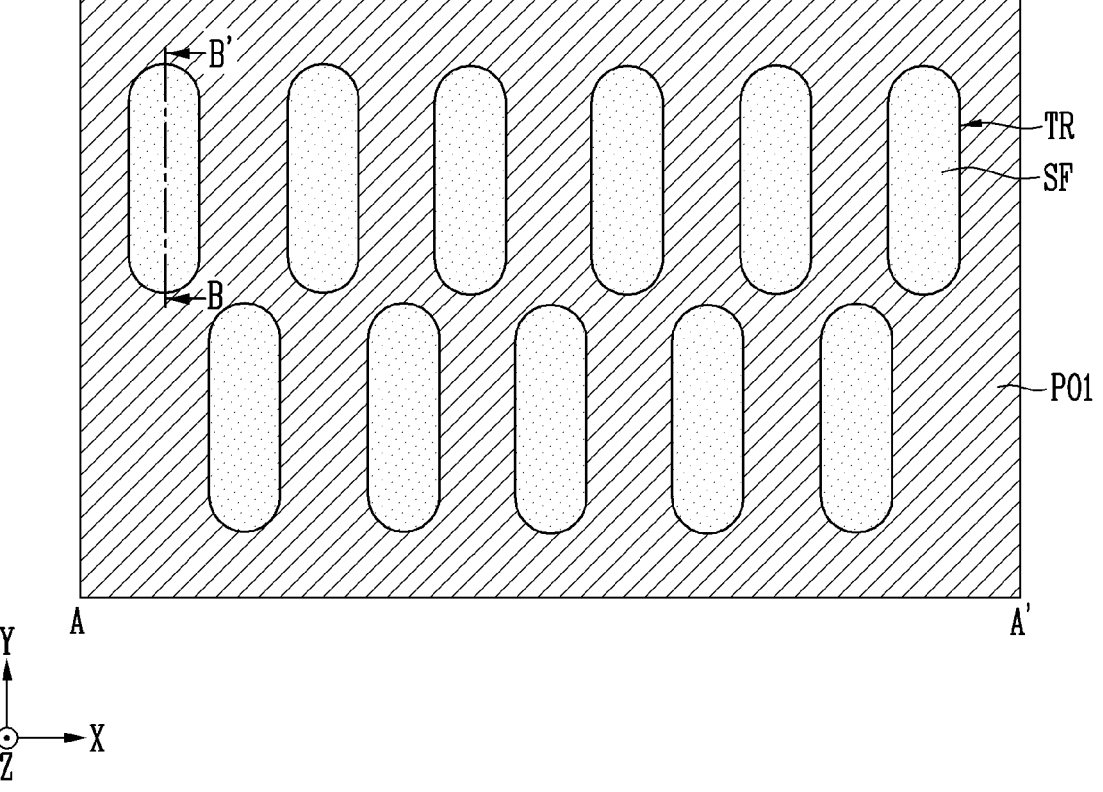
FIGS. 5A to 5B, FIGS. 6A to 6B, FIGS. 7A to 7B, FIGS. 8A to 8B, and FIGS. 9A to 9B are views illustrating a method of manufacturing a row decoder according to an embodiment of the present disclosure.
Figure 5B:
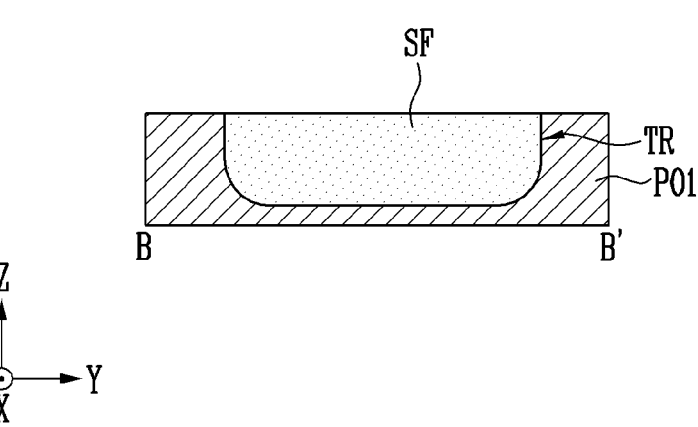

Referring to FIGS. 5A and 5B, a first material layer PO1 may be formed on a substrate (not illustrated). The first material layer PO1 may be a conductive layer, for example, a polysilicon layer. In an embodiment, before the first material layer PO1 is formed, an insulating layer (not illustrated) may be formed, and the first material layer PO1 may be formed on the insulating layer.

A trench TR may be formed in the first material layer PO1. The cross-section of the trench TR may have a major axis in a Y direction and a minor axis in an X direction.

A sacrificial layer SF may be formed in the trench TR. The sacrificial layer SF may be formed of a material having etch selectivity with respect to the first material layer PO1, for example, a nitride layer.

Figure 6A:
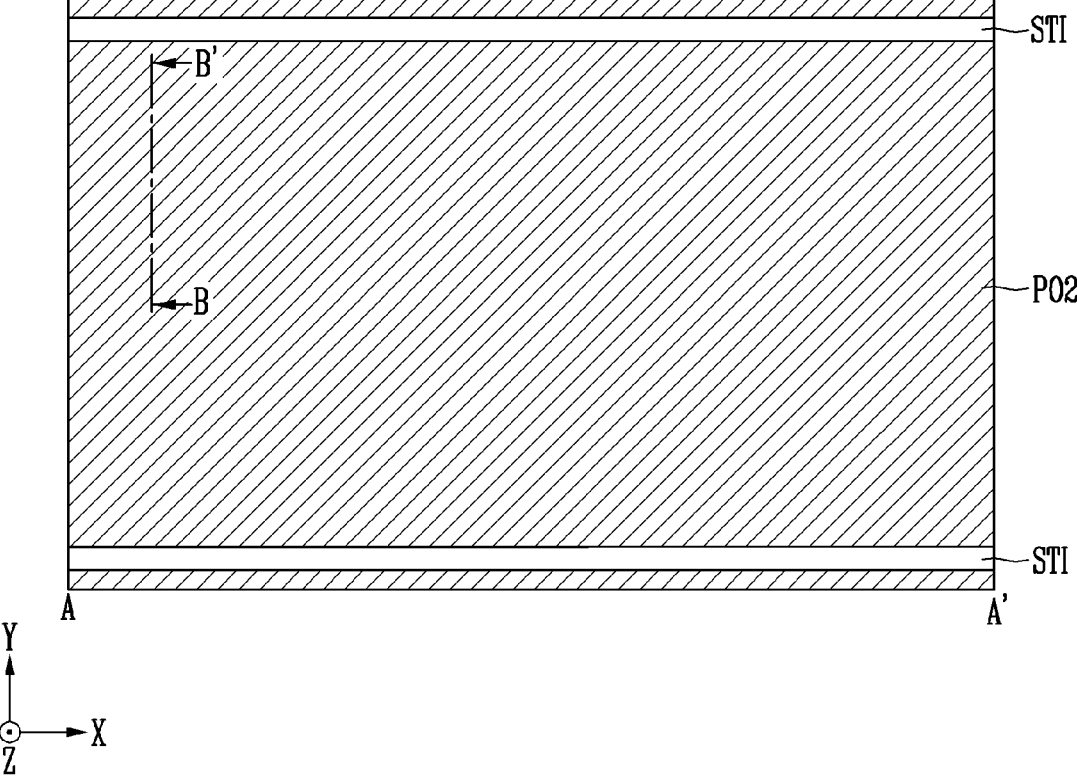
Figure 6B:
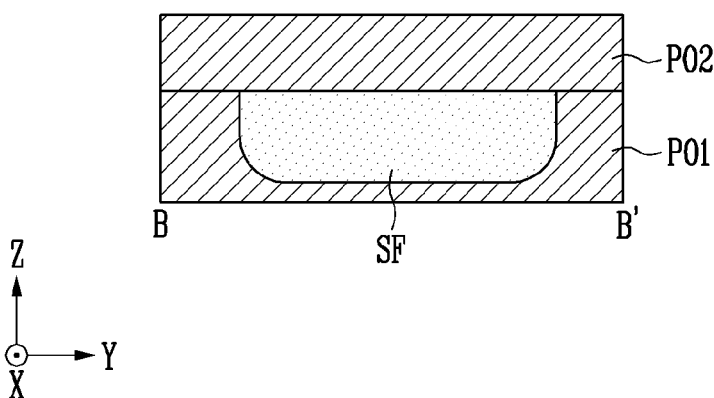

Referring to FIGS. 6A and 6B, a second material layer PO2 may be formed on the first material layer PO1 and the sacrificial layer SF. The second material layer PO2 may be formed of the same material as the first material layer PO1, for example, polysilicon.

Slit trenches ST1 passing through the first material layer PO1 and the second material layer PO2 may be formed. The slit trenches ST1 may extend in the X direction.

Figure 7A:
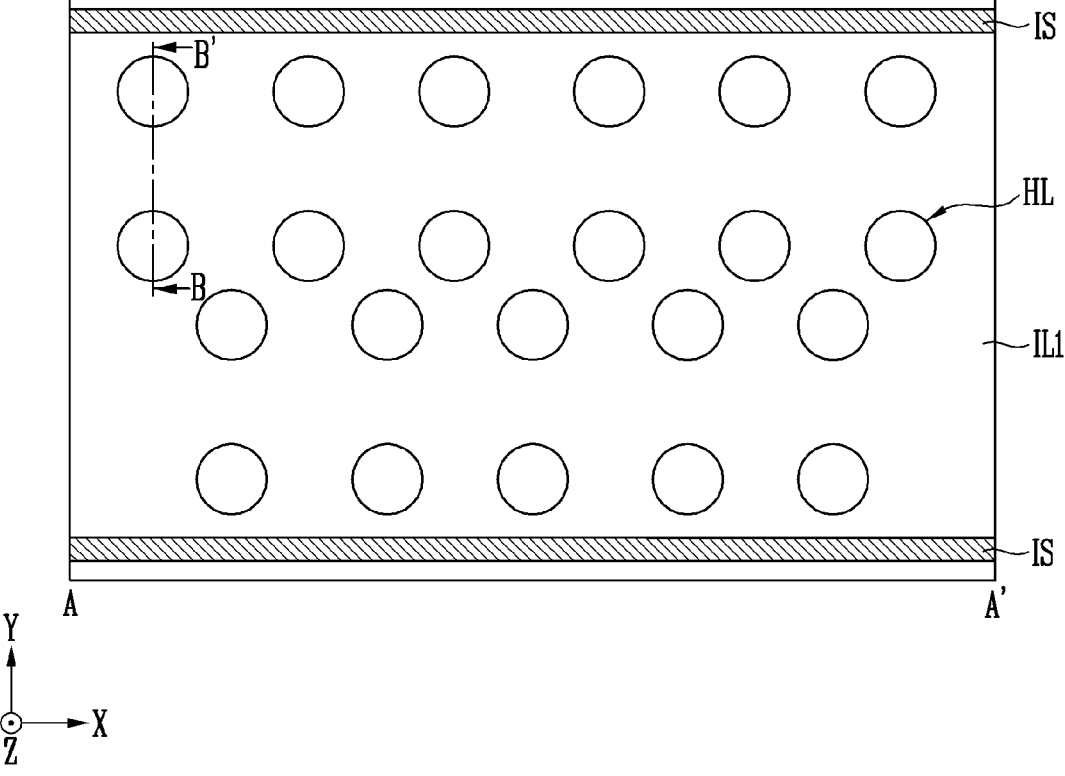
Figure 7B:
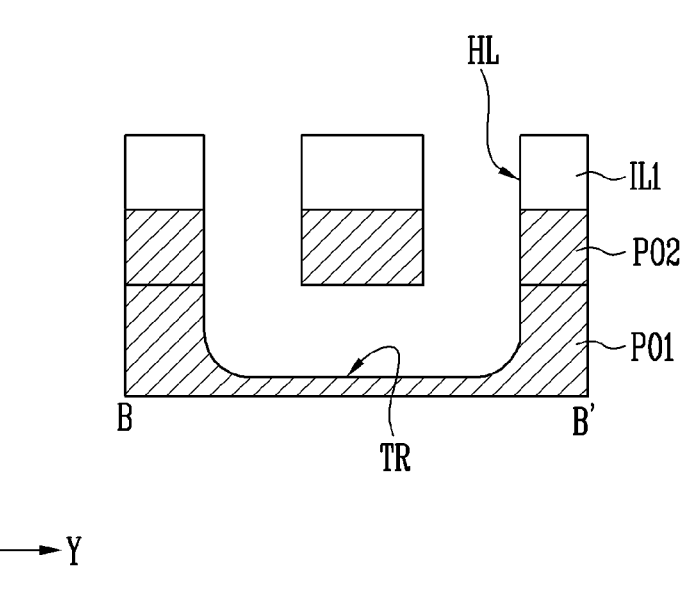

Referring to FIGS. 7A and 7B, holes HL passing through the second material layer PO2 to expose a portion of the sacrificial layer SF may be formed. In an embodiment, a first insulating layer IL1 may be formed on the second material layer PO2, and the holes HL passing through the second material layer PO2 and the first insulating layer IL1 may be formed. The holes HL may be formed to overlap the trench TR. For example, the holes HL may be formed on the trench TR such that two holes HL overlap one trench TR.

The sacrificial layer SF exposed through the holes HL may be removed. As the sacrificial layer SF is removed, an opening in which the holes HL and the trench TR are coupled to each other may be formed.

In an embodiment, an etching process for the opening may be further performed. In an example, a portion of the first material layer PO1 exposed through the trench TR may be etched, and thus the size of the trench TR may be expanded. In an example, a portion of the second material layer PO2 exposed through the holes HL may be etched, and thus the sizes of the holes HL may be expanded. Through the etching process, the inner walls of the trench TR and the holes HL may be planarized. The etching process may be performed as a high-temperature wet etching process.

Figure 8A:
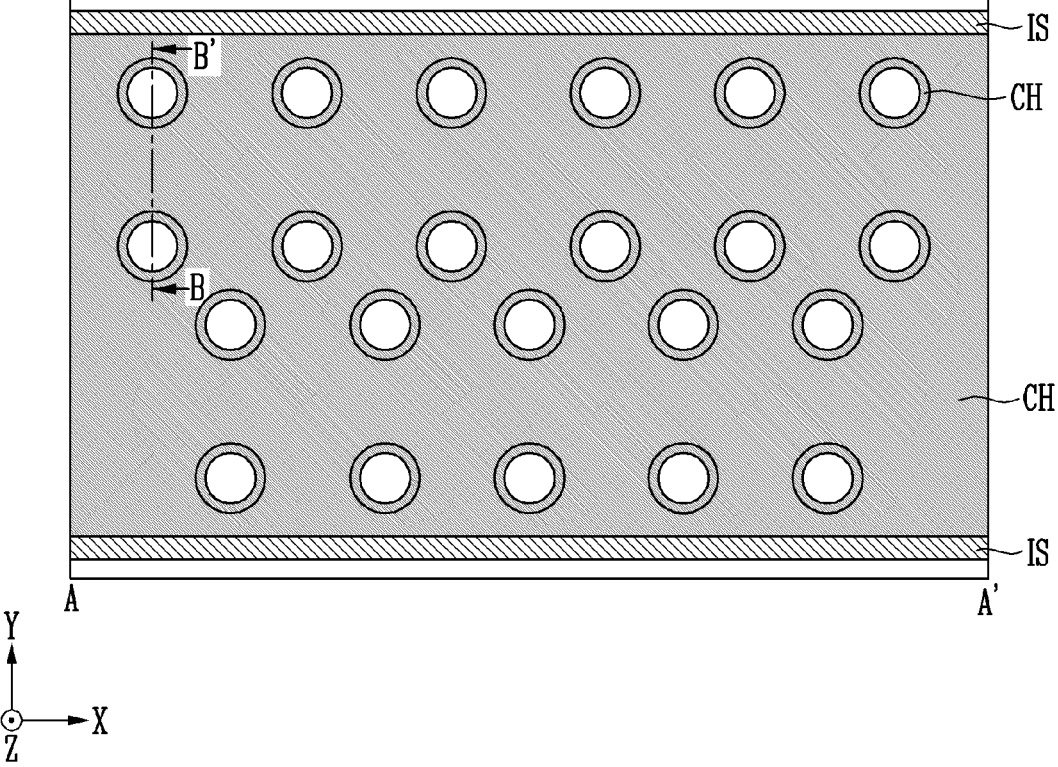
Figure 8B:
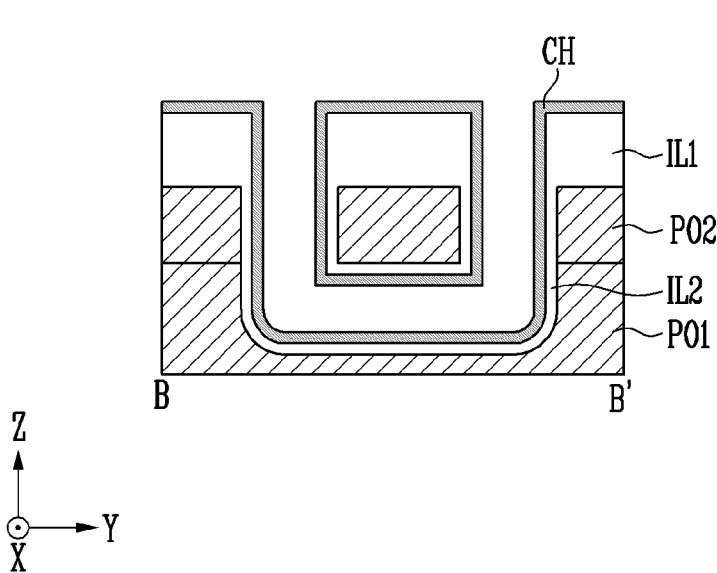

Referring to FIGS. 8A and 8B, a channel layer CH may be formed along the inner walls of the trench TR and the holes HL. The channel layer CH may also be formed on the first insulating layer IL1 together with the inner walls of the trench TR and the holes HL.

In an embodiment, a second insulating layer IL2 may be formed along the inner walls of the trench TR and the holes HL, and the channel layer CH may be formed on the inner wall of the second insulating layer IL2. The second insulating layer IL2 may be an oxide layer formed using an oxidization method or a deposition method.

Figure 9A:
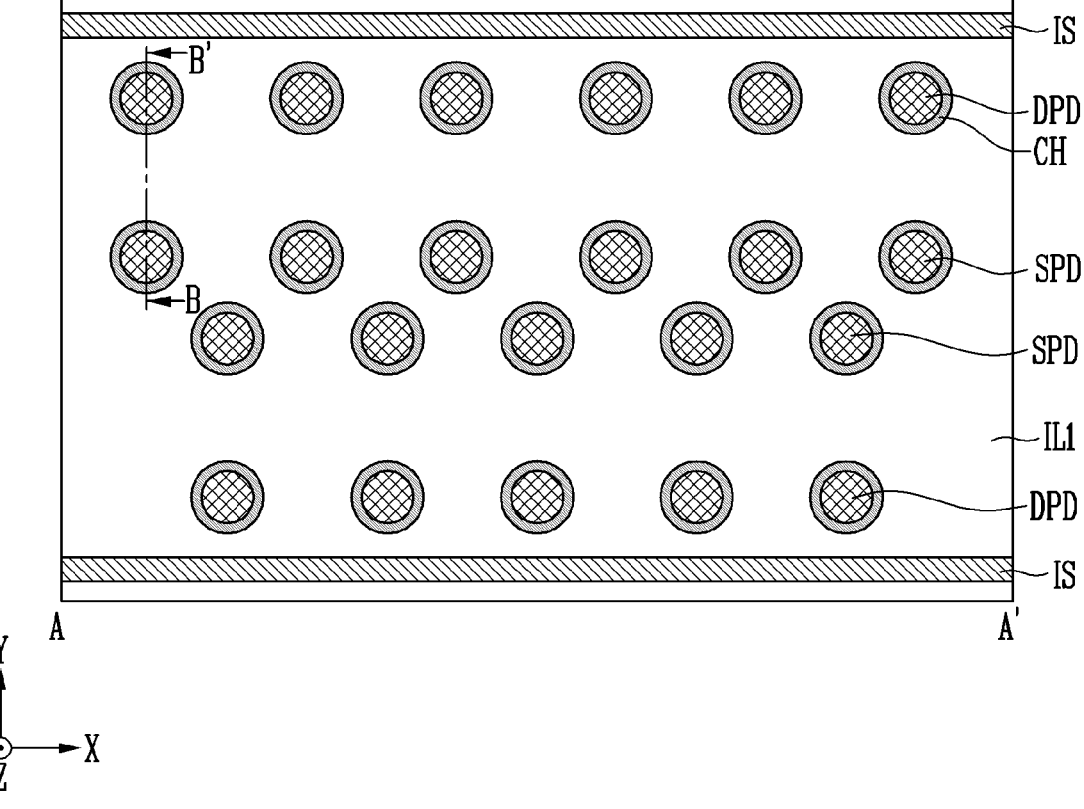
Figure 9B:
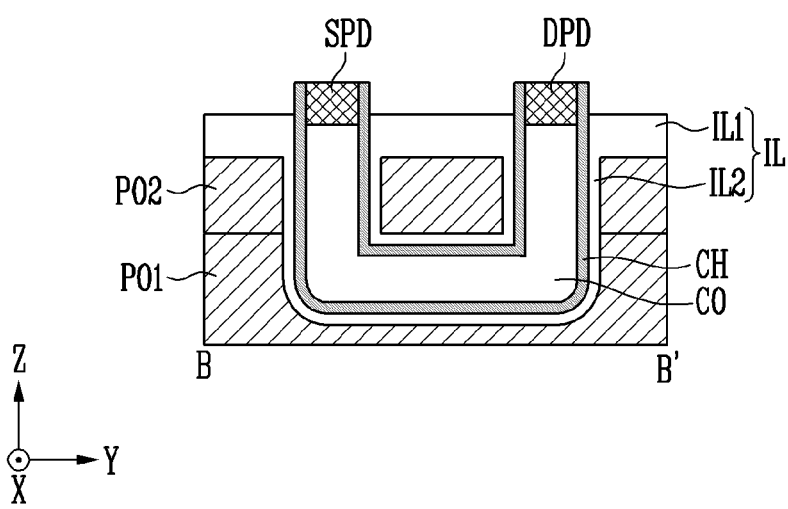

Referring to FIGS. 9A and 9B, an insulating column CO may be formed in the trench TR and the holes HL along which the channel layer CH is formed. Pads (e.g., a source pad SPD and a drain pad DPD) may be formed on the insulating column CO exposed through the holes HL. For example, when a portion of the insulating column CO formed in the holes HL is removed, a source region may be formed in a first hole among the holes HL, and a drain region may be formed in the remaining hole among the holes HL, that is, a second hole. The source region and the drain region may be filled with a conductive layer (e.g., polysilicon). The conductive layer filling the source region of the first hole may be the source pad SPD, and the conductive layer filling the drain region of the second hole may be the drain pad DPD. Each of the source pad SPD and the drain pad DPD may be enclosed by the channel layer CH.

Next, an etching process for removing a portion of the channel layer CH formed on a plane between the source pad SPD and the drain pad DPD may be performed. When the portion of the channel layer CH on the plane is removed, a portion of the first insulating layer IL1 formed between the source pad SPD and the drain pad DPD may be exposed, and the exposed portion of the first insulating layer IL1 may be etched. As the portion of the first insulating layer IL1 is etched and the thickness of the first insulating layer IL1 is reduced, the source pad SPD, the drain pad DPD, and portions of the channel layer CH may protrude higher than the first insulating layer IL1 in the Z direction.

Referring to FIGS. 9B and 4B, a global line GL may be formed on the source pad SPD, and a local pad LP may be formed on the drain pad DPD. Further, referring to FIGS. 9B and 3, gate lines 21 stacked on local pads LP may be formed. Further, a third interconnection structure IC3 which electrically connects the respective gate lines 21 to the local pads LP may be formed.

The first material layer PO1 and the second material layer PO2, illustrated in FIGS. 5B to 9B, may form the block word line BWL, illustrated in FIG. 4A. For example, a portion of the second material layer PO2 may correspond to a first gate layer GT1 and the remaining portion of the second material layer PO2 and the first material layer PO1 may correspond to a second gate layer GT2.

Also, the first insulating layer IL1 and the second insulating layer IL2 illustrated in FIGS. 7B to 9B may respectively correspond to the upper insulating layer UIL and the gate insulating layer GIL of FIG. 4B.

Figure 10:
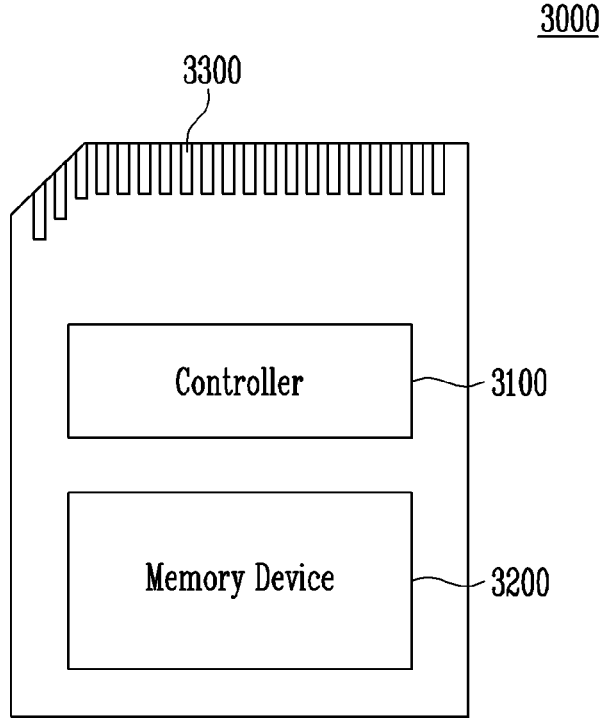
FIG. 10 is a diagram illustrating a memory card system to which a memory device according to an embodiment of the present disclosure is applied.

FIG. 10 is a diagram illustrating a memory card system to which a memory device according to an embodiment of the present disclosure is applied.

Referring to FIG. 10, a memory card system 3000 may include a controller 3100, a memory device 3200, and a connector 3300.

The controller 3100 may be coupled to the memory device 3200. The controller 3100 may access the memory device 3200. For example, the controller 3100 may control a program operation, a read operation, or an erase operation of the memory device 3200, or may control a background operation of the memory device 3200. The controller 3100 may provide an interface between the memory device 3200 and a host. The controller 3100 may run firmware for controlling the memory device 3200. In an example, the controller 3100 may include components, such as a random-access memory (RAM), a processor, a host interface, a memory interface, and an error corrector.

The controller 3100 may communicate with an external device through the connector 3300. The controller 3100 may communicate with an external device (e.g., a host) based on a specific communication standard. In an embodiment, the controller 3100 may communicate with the external device through at least one of various communication standards such as universal serial bus (USB), multimedia card (MMC), embedded MMC (eMMC), peripheral component interconnection (PCI), PCI-express (PCI-E), advanced technology attachment (ATA) protocol, serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe). In an embodiment, the connector 3300 may be defined by at least one of the above-described various communication standards.

The memory device 3200 may include a plurality of memory cells, and may be configured in the same manner as the memory device 100 illustrated in FIG. 1.

The controller 3100 and the memory device 3200 may be integrated into a single memory device to form a memory card. For example, the controller 3100 and the memory device 3200 may be integrated into a single memory device, and may then form a memory card such as a personal computer memory card international association (PCMCIA) card, a compact flash card (CF), a smart media card (SM or SMC), a memory stick, a multimedia card (MMC, RS-MMC, MMCmicro or eMMC), an SD card (SD, miniSD, microSD, or SDHC), or a universal flash storage (UFS).

Figure 11:
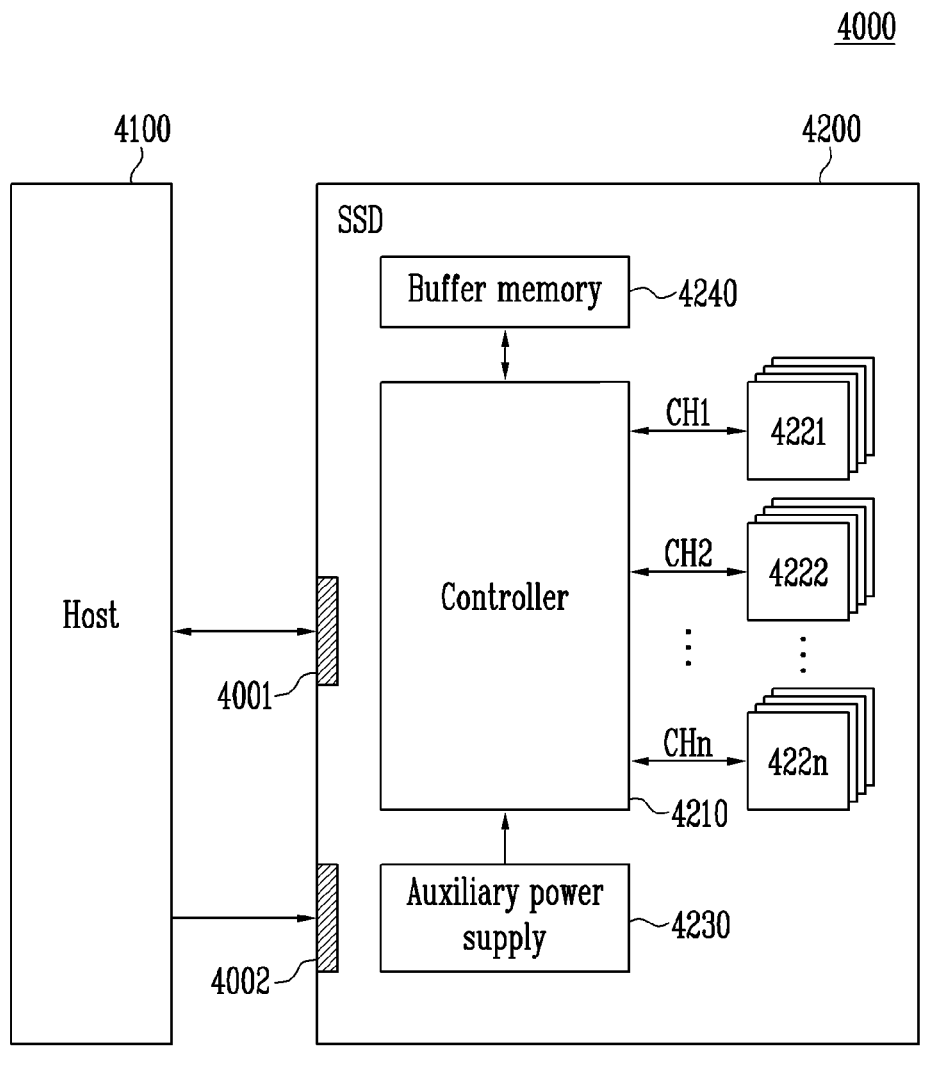
FIG. 11 is a diagram illustrating a solid-state drive (SSD) system to which a memory device according to the present disclosure is applied.

FIG. 11 is a diagram illustrating a solid-state drive (SSD) system to which a memory device according to the present disclosure is applied.

Referring to FIG. 11, an SSD system 4000 may include a host 4100 and an SSD 4200. The SSD 4200 may exchange signals with the host 4100 through a signal connector 4001, and may receive power through a power connector 4002. The SSD 4200 may include a controller 4210, a plurality of memory devices 4221 to 422n, an auxiliary power supply 4230, and a buffer memory 4240.

The controller 4210 may control the plurality of memory devices 4221 to 422n in response to signals received from the host 4100. In an embodiment, the received signals may be signals based on the interfaces of the host 4100 and the SSD 4200. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe).

Each of the plurality of memory devices 4221 to 422n may include a plurality of memory cells configured to store data. Each of the memory devices 4221 to 422n may be configured in the same manner as the memory device 100 illustrated in FIG. 1. The plurality of memory devices 4221 to 422n may communicate with the controller 4210 through channels CH1 to CHn.

The auxiliary power supply 4230 may be coupled to the host 4100 through the power connector 4002. The auxiliary power supply 4230 may be supplied with a supply voltage from the host 4100, and may be charged. The auxiliary power supply 4230 may provide the supply voltage of the SSD 4200 when the supply of power from the host 4100 is not smoothly performed. In an embodiment, the auxiliary power supply 4230 may be located inside the SSD 4200 or located outside the SSD 4200. For example, the auxiliary power supply 4230 may be located in a main board, and may provide auxiliary power to the SSD 4200.

The buffer memory 4240 may function as a buffer memory of the SSD 4200. For example, the buffer memory 4240 may temporarily store data received from the host 4100 or data received from the plurality of memory devices 4221 to 422n, or may temporarily store metadata (e.g., mapping tables) of the memory devices 4221 to 422n. The buffer memory 4240 may include volatile memory, such as a dynamic random-access memory (DRAM), synchronous DRAM (SDRAM), double data rate (DDR) SDRAM, and low power DDR (LPDDR) SDRAM, or nonvolatile memory, such as ferroelectric RAM (FRAM), resistive RAM (ReRAM), spin transfer torque magnetic RAM (STT-MRAM), and phase-change RAM (PRAM).

The present disclosure may provide a memory device in which the area of a peripheral circuit included therein is reduced.

What is claimed is:

1. A memory device, comprising:
first and second vertical structures spaced apart from each other;
a connection structure contacting bottoms of the first and second vertical structures;
a first gate layer disposed between the first and second vertical structures;
a second gate layer enclosing the first and second vertical structures and the connection structure;
a global line disposed on the first vertical structure; and
a local line disposed on the second vertical structure.

2. The memory device according to claim 1, wherein each of the first and second vertical structures comprises:
a vertical channel layer;
a vertical insulating column enclosed by the vertical channel layer; and
a pad disposed on the vertical insulating column.

3. The memory device according to claim 2, wherein the pad is enclosed by the vertical channel layer.

4. The memory device according to claim 2, wherein the pad comprises:
a source pad included in the first vertical structure; and
a drain pad included in the second vertical structure.

5. The memory device according to claim 4, further comprising:
a first interconnection structure connecting the source pad to the global line and connecting the drain pad to the local line.

6. The memory device according to claim 2, wherein the connection structure comprises:
a horizontal channel layer; and
a horizontal insulating column enclosed by the horizontal channel layer.

7. The memory device according to claim 6, wherein:
the vertical channel layer and the horizontal channel layer extend to each other, and
the vertical insulating column and the horizontal insulating column extend to each other.

8. The memory device according to claim 1, wherein the first and second gate layers extend to each other to enclose the first and second vertical structures and the connection structure.

9. The memory device according to claim 1, wherein the first gate layer is disposed on the connection structure.

10. The memory device according to claim 1, further comprising:
a gate insulating layer disposed between the first and second vertical structures and the first and second gate layers and between the connection structure and the first and second gate layers.

11. The memory device according to claim 1, wherein the local line comprises:
a local pad disposed on the second vertical structure;
a gate line stacked on the local pad; and
a second interconnection structure connecting the local pad to the gate line.

12. The memory device according to claim 1, wherein the first and second vertical structures and the connection structure are implemented as a pass transistor configured to electrically connect or disconnect the global line and the local line to or from each other.

* * * * *